United States Patent

Spilker, Jr. et al.

[11] Patent Number: 5,815,046
[45] Date of Patent: Sep. 29, 1998

[54] TUNABLE DIGITAL MODULATOR INTEGRATED CIRCUIT USING MULTIPLEXED D/A CONVERTERS

[75] Inventors: James J. Spilker, Jr., Woodside; James D. McVey, Palo Alto, both of Calif.

[73] Assignee: Stanford Telecom, Sunnyvale, Calif.

[21] Appl. No.: 797,361

[22] Filed: Feb. 11, 1997

[51] Int. Cl.⁶ ............ H04L 27/20; H04L 27/36; H03M 1/08
[52] U.S. Cl. ............ 332/103; 375/261; 375/279; 375/298; 375/308; 341/118; 341/144
[58] Field of Search ............... 332/103, 104, 332/105; 375/261, 279, 281, 298, 308; 341/118, 144

[56] References Cited

U.S. PATENT DOCUMENTS

| 3,877,023 | 4/1975 | Spicer et al. | 341/118 |
| 5,293,407 | 3/1994 | Shibata | 332/103 |
| 5,412,352 | 5/1995 | Graham | 332/103 |

OTHER PUBLICATIONS

Kushner et al., "Spurious Reduction for Direct Digital Synthesizers," Applied Microwave & Wireless, Summer 1996, pp. 44, 46, 48, 50, 52, 55, 56, 58, 60, 63.

Samueli et al., "VLSI Architectures for a High–Speed Tunable Digital Modulator/Demodulator/Bandpass–Filter Chip Set," 1992 IEEE International Symposium on Circuits and Systems, vol. 3 of 6, May 10–13, 1992, pp. 1065–1068.

*Primary Examiner*—Siegfried H. Grimm
*Attorney, Agent, or Firm*—Townsend and Townsend and Crew LLP; Henry K. Woodward

[57] ABSTRACT

A tunable digital modulator is tunable across an R.F. frequency range for transmission without additional frequency conversion and includes two toggled multiplexed analog-to-digital converters for reducing spurious frequency components in the output. The modulator and digital-to-analog converters are fabricated in a single integrated circuit with the two converters laid out physically in adjacent spaces with their gain and voltage characteristics matched. By alternating the two digital-to-analog converters in producing the analog modulated signal output, transients from switching of the converters have a chance to die out before the output of each converter is sampled. Thus, any spurious glitch energy is greatly attenuated.

13 Claims, 1 Drawing Sheet

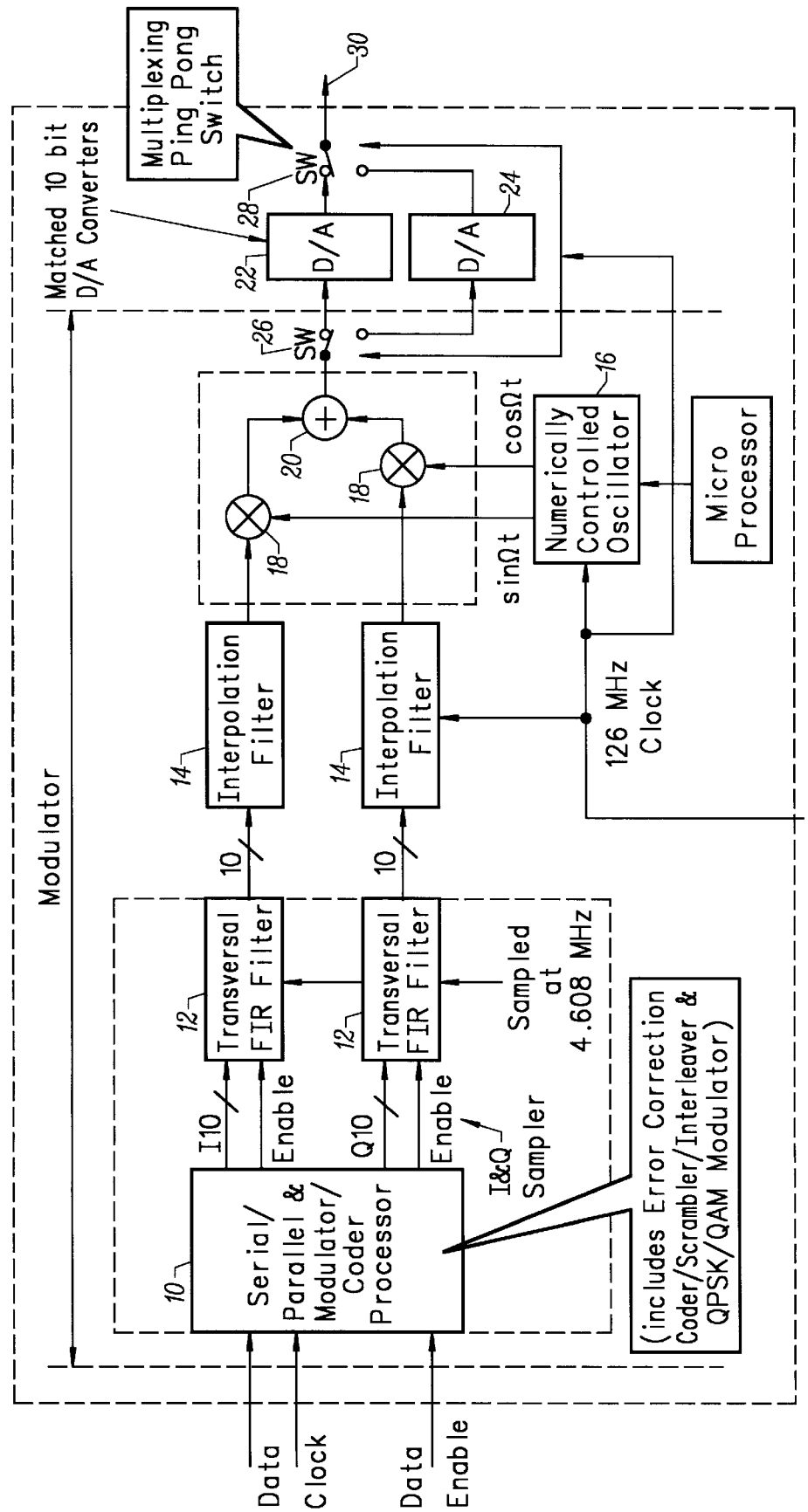

TUNABLE DIGITAL MODULATOR INTEGRATED CIRCUIT USING MULTIPLEXED D/A CONVERTERS

BACKGROUND OF THE INVENTION

This invention relates generally to data transmission, and more particularly the invention relates to a tunable digital modulator for use in data transmission and to multiplexed digital-to-analog converters (DAC) used therein.

Disclosed in U.S. Pat. No. 5, 412,352, assigned to Stanford Telecommunications, Inc., is a modulator having direct digital synthesis for broadband R.F. transmission such as in the upstream of a CATV cable. To satisfy interactivity in the information highway, a return path has been provided in the frequency spectrum of 5–40 MHz from a subscriber to the head end unit. The modulator provides a modulated tunable signal by direct frequency synthesis which is converted from digital form to analog form for transmission in the cable.

A major difficulty in achieving satisfactory operation with such a system is that contrary to other uses of digital-to-analog converters, in this application spurious frequency components in the output must be extremely small so that they do not interfere with other signals being transmitted over the same coaxial cable communications media. Since there may be many such digital tunable modulators transmitting on the same cable at the same time, their accumulated spurious interference can be quite large unless each modulator has very low (<−50 Db relative to the desired signal) spurious frequency components.

SUMMARY OF THE INVENTION

In accordance with the present invention a tunable digital modulator integrated circuit chip includes multiplexed digital-to-analog converters integrated therewith which provide sufficiently low spurious frequency components. Two digital-to-analog converters are identical and are laid out physically in adjacent spaces with their gain and voltage characteristics carefully matched in the design of the integrated circuit. The two converters are used in alternate time slots whereby transients from the switching of the converters have time to die out before each converter is sampled. Thus, any spurious glitch energy is greatly attenuated.

In a preferred embodiment, a tunable digital modulator includes a processor for receiving and modulating a digital data stream to provide a modulated data stream, a mixer driven by a numerically controlled oscillator for receiving the modulated digital data stream and up-converting the frequency of the modulated digital data stream. The digital-to-analog converter then receives and converts the up-converted modulated digital data stream to analog form, the converter including a first digital-to-analog converter, a second digital-to-analog converter, a first switch for alternately connecting the up-converted modulated digital data stream, to inputs of the first and second digital-to-analog converters, and a second switch for alternately connecting analog signals from outputs of the first and second digital-to-analog converters to a modulator output.

The processor can provide in-phase and quadrature phase modulated data streams, and the mixer then includes an in-phase mixer and a quadrature phase mixer each driven by the numerically controlled oscillator. An adder then combines up-converted in-phase and quadrature phase modulated digital data streams. The modulator can provide quadrature amplitude modulation (QAM) as well as quadrature phase shift keying (QPSK).

The invention and objects and features thereof will be more readily apparent from the following detailed description and appended claims when taken with the drawing.

BRIEF DESCRIPTION OF THE DRAWING

The drawing is a schematic of a tunable digital modulator including multiplexed digital-to-analog converters suitable for high speed communications over cable in accordance with the invention.

DETAILED DESCRIPTION OF ILLUSTRATED EMBODIMENT

The FIGURE shows a block diagram of a tunable digital modulator integrated circuit chip in accordance with one embodiment of the invention. Serial data and a clock are received by serial/parallel and modulator/coder processor 10 along with a data enable signal. The data are converted by the serial/parallel converter to words of appropriate size that match the modulation. The bits are then scrambled in a typical manner, interleaved, and coded using a Reed-Solomon coding algorithm, and fed to the BPSK, QPSK, or QAM digital processor, which in turn generates the digital words to modulate in-phase and quadrature phase carrier components.

The modulator output is then fed to appropriate bandwidth reduction transfer filters 12 and serially connected interpolation filters 14 to produce a high speed output at a clock rate on the order of 126 Mhz. This signal is then digitally tuned in frequency using a numeric controlled oscillator 16 which drives mixers 18 and produce the samples in digital form of the actual desired coded modulated waveform at the desired frequency. The up-converted modulated digital data streams from the two mixers 18 are then added at 20, and the combined up-converted modulated digital data stream is then applied to a pair of digital-to-analog converters (DAC) 22, 24 through a first switch 26.

The D/A converter must operate at a relatively high clock rate and be incorporated on the same semiconductor chip as the digital modulator/coder logic and produce exceptionally low harmonic distortion and aliased components. The two separate D/A converters 22, 24 are laid out physically in adjacent spaces on the integrated circuit, and their gain and voltage characteristics carefully matched. Internal to each D/A converter are approximately 260 current sources which must be switched on and off at the clock rate with 260 switches, thus making the design task very difficult. Heretofore, the use of two identical D/A converters has been employed to reduce spurious signals, but in these prior art applications the outputs of the two D/A converters are subtracted to cancel some of the distortion. In the present invention the two D/A converters are used in alternate time slots by means of the input switch 26 and an output switch 28. Thus, the transients from the switching of each D/A converter have time to die out before the converter is sampled, and any spurious glitch energy is greatly attenuated. Importantly, the task of building one clean switch is much simpler than that of building 260 precise switches in each DAC.

Alternate digital samples (typically 10 bits each) are fed to each of the two D/A converters 22, 24. Since each converter is operating at half of the clock rate in a toggled or ping pong fashion, only the latter portions of their outputs need to be used and the major part of the transient overshoot and ripple can be avoided. The outputs of the two D/A converters are then switched to a common output terminal 30 through switch 28 after they have had a chance to settle close to their steady state values.

A tunable digital modulator using multiplexed digital-to-analog converters in accordance with the invention can be low cost through integration in a common semiconductor chip. The task of controlling the output spurious intermodulation components is reduced to laying out two converters which are carefully matched in design and providing two good output switches, clearly much easier than building and optimizing 260 or so individual current switches in each converter. While the invention has been described with reference to a specific embodiment, the description is illustrative of the invention and is not to be construed as limiting the invention. Various modifications and applications may occur to those skilled in the art without departing from the true spirit and scope of the invention as defined by the appended claims.

What is claimed is:

1. A tunable digital modulator comprising
    a processor for receiving and modulating a digital data stream to provide a modulated data stream,
    a mixer driven by a numerically controlled oscillator for receiving the modulated digital data stream and up-converting the frequency of the modulated digital data stream, and
    a converter for receiving and converting the up-converted modulated digital data stream to analog form, said converter including a first digital-to-analog converter, a second digital-to-analog converter, a first switch for alternately connecting the up-converted modulated digital data stream to inputs of the first and second digital-to-analog converters, and a second switch for alternately connecting analog signals from outputs of the first and second digital-to-analog converters to a modulator output.

2. The tunable digital modulator as defined by claim 1 wherein said processor provides in-phase and quadrature phase modulated digital data streams, said mixer includes an in-phase mixer and quadrature phase mixer each driven by said numerically controlled oscillator, and an adder for combining up-converted in-phase and quadrature phase modulated digital data streams.

3. The tunable digital modulator as defined by claim 2 wherein said processor provides a plurality of modulations including BPSK, QPSK, and QAM.

4. The tunable digital modulator as defined by claim 3 wherein said processor also provides error correction coding, interleaving, and scrambling.

5. The tunable digital modulator as defined by claim 2 and including filters for filtering the in-phase and quadrature phase modulated data streams.

6. The tunable digital modulator as defined by claim 5 wherein said filters include a first transversal FIR filter serially connected with a first interpolation filter, and a second transversal FIR filter serially connected with a second interpolation filter.

7. The tunable digital modulator as defined by claim 6 wherein said numerically controlled oscillator is driven by a clock having a frequency at least twice the highest frequency in the up-converted modulated digital data stream.

8. The tunable digital modulator as defined by claim 1 and including a filter for filtering the modulated digital data stream.

9. The tunable digital modulator as defined by claim 8 wherein said filter includes a transversal FIR filter serially connected with an interpolation filter.

10. The tunable digital modulator as defined by claim 9 wherein said numerically controlled oscillator is driven by a clock having a frequency at least twice the highest frequency in the up-converted modulated digital data stream.

11. The tunable digital modulator as defined by claim 1 wherein said numerically controlled oscillator is driven by a clock having a frequency at least twice the highest frequency in the up-converted modulated digital data stream.

12. The tunable digital modulator as defined by claim 1 wherein said modulator comprises an integrated circuit.

13. An analog-to-digital converter for converting a digital data stream to an analog data stream with suppressed spurious intermodulation components comprising
    a first digital-to-analog converter having an input and an output,
    a second digital-to-analog converter having an input and an output,
    a first switch for alternately connecting a digital data stream to said inputs of the first and second digital-to-analog converters, and
    a second switch for alternately connecting analog signals from said outputs of the first and second digital-to-analog converters to a common output terminal.

* * * * *